United States Patent
Gu et al.

(10) Patent No.: US 9,828,544 B2
(45) Date of Patent: Nov. 28, 2017

(54) COMPOSITE FILM AND FABRICATION METHOD THEREOF, PHOTOELECTRIC ELEMENT AND PHOTOELECTRIC APPARATUS

(71) Applicant: BOE TECHNOLOGY GROUP CO., LTD., Beijing (CN)

(72) Inventors: Jingxia Gu, Beijing (CN); Chen Tang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/426,811

(22) PCT Filed: Jul. 25, 2014

(86) PCT No.: PCT/CN2014/083081
§ 371 (c)(1),
(2) Date: Mar. 9, 2015

(87) PCT Pub. No.: WO2015/058567
PCT Pub. Date: Apr. 30, 2015

(65) Prior Publication Data
US 2015/0329774 A1    Nov. 19, 2015

(30) Foreign Application Priority Data
Oct. 21, 2013  (CN) .......................... 2013 1 0495376

(51) Int. Cl.
*C09K 11/06* (2006.01)
*C09K 11/56* (2006.01)
(Continued)

(52) U.S. Cl.
CPC ............ *C09K 11/565* (2013.01); *B05D 1/005* (2013.01); *C08G 61/02* (2013.01); *C08K 3/30* (2013.01);
(Continued)

(58) Field of Classification Search
CPC ....... C09K 11/06; C09K 11/08; C09K 11/881; C09K 2211/14; H01L 51/0039;
(Continued)

(56) References Cited

U.S. PATENT DOCUMENTS

2005/0002635 A1*  1/2005  Banin .................... C09K 11/02
                                                          385/147
2013/0203198 A1*  8/2013  Min ...................... H01L 51/428
                                                           438/46

FOREIGN PATENT DOCUMENTS

CN         1772837 A       5/2006
CN       101314665 A      12/2008
(Continued)

OTHER PUBLICATIONS

Chou et al., Hybrid White-Light Emitting-LED Based on Luminescent Polyfluorene Polymer and Quantum Dots, 2007, Journal of Nanoscience and Nanotechnology, vol. 7, pp. 2785-2789.*
(Continued)

*Primary Examiner* — Matthew E Hoban
*Assistant Examiner* — Lynne Edmondson
(74) *Attorney, Agent, or Firm* — Collard & Roe, P.C.

(57) ABSTRACT

Embodiments of the invention relate to a composite film and a fabrication method thereof, a photoelectric element and a photoelectric apparatus. The fabrication method of the composite film includes: preparing a polyfluorene-based compound solution, wherein the polyfluorene-based compound solution includes polyfluorene or polyfluorene derivatives; preparing a quantum dot solution; mixing the polyfluorene-based compound solution and the quantum dot solution together to prepare a mixed solution; removing a solvent in the mixed solution to prepare the composite film.

5 Claims, 1 Drawing Sheet

(51) Int. Cl.
    *H01L 33/06*     (2010.01)
    *B05D 1/00*     (2006.01)
    *C08G 61/02*     (2006.01)
    *H01L 51/00*     (2006.01)
    *C08K 3/30*     (2006.01)
    *H01L 51/50*     (2006.01)

(52) U.S. Cl.
    CPC .............. *C09K 11/06* (2013.01); *H01L 33/06* (2013.01); *H01L 51/0003* (2013.01); *C08G 2261/1412* (2013.01); *C08G 2261/3142* (2013.01); *C08G 2261/5222* (2013.01); *C08G 2261/95* (2013.01); *C08K 2003/3036* (2013.01); *C09K 2211/1416* (2013.01); *H01L 51/0039* (2013.01); *H01L 51/502* (2013.01)

(58) Field of Classification Search
    CPC ... H01L 51/502; H01L 51/56; H01L 51/0003; H01L 51/0007; H01L 51/0043; H01L 51/0004; C08G 2261/3142; C08G 2261/5222; C08G 2261/95; Y02B 20/181
    USPC ..................................................... 252/301.33
    See application file for complete search history.

(56) References Cited

FOREIGN PATENT DOCUMENTS

| | | | | |
|---|---|---|---|---|
| CN | 101328303 A | 12/2008 | | |
| CN | 102295745 A | 12/2011 | | |
| KR | WO 2012047042 A2 * | 4/2012 | ........... | H01L 51/428 |

OTHER PUBLICATIONS

Wang et al., "Photoinduced Charge Transfer and Efficient Solar Energy Conversion in a Blend of a Red Polyfluorene Copolymer with CdSe Nanoparticles", Jul. 19, 2006, Nano Letters, vol. 6, No. 8, pp. 1789-1793.*
Guo et al., "CdSe/ZnS Nanoparticle Composites with Amine-Functionalized Polyfluorene Derivatives for Polymeric Light-Emitting Diodes: Synthesis, Photophysical Properties, and the Electroluminescent Performance", Feb. 1, 2010, Macromolecules, 43, pp. 1860-1866.*
International Search Report and Written Opinion of the International Searching Authority with Notice of Transmittal of the International Search Report and Written Opinion of PCT/CN2014/083081 in Chinese, dated Oct. 31, 2014.
English translation of the International Search Report of PCT/CN2014/083081, dated Oct. 31, 2014.
English translation of the Written Opinion of the International Searching Authority of PCT/CN2014/083081, dated Oct. 31, 2014.
First Chinese Office Action of Chinese Application No. 201310495376.X, dated Jun. 30, 2014 with English translation.
Second Chinese Office Action of Chinese Application No. 201310495376.X, dated Feb. 3, 2015 with English translation.
The Notification to Grant the Patent Right (Notice of Allowance) for 201310495376.X dated Jul. 21, 2015 with English translation.
The Issued Patent for CN 103525406B (Application No. CN 201310495376.X) which was granted on Aug. 26, 2015 in Chinese with the Chinese granted claims with an English translation.

* cited by examiner

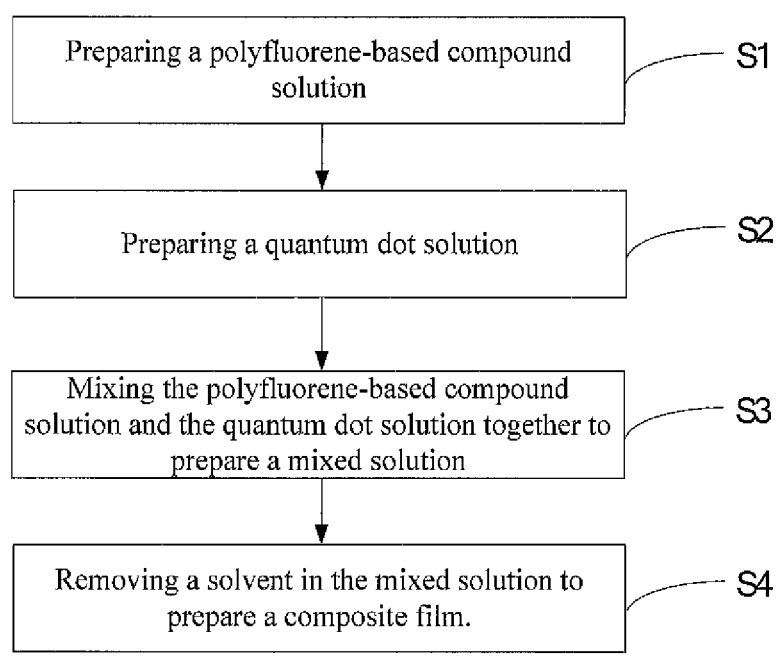

COMPOSITE FILM AND FABRICATION METHOD THEREOF, PHOTOELECTRIC ELEMENT AND PHOTOELECTRIC APPARATUS

CROSS REFERENCE TO RELATED APPLICATIONS

This application is the National Stage of PCT/CN2014/083081 filed on Jul. 25, 2014, which claims priority under 35 U.S.C. §119 of Chinese Application No. 201310495376.X filed on Oct. 21, 2013, the disclosure of which is incorporated by reference.

TECHNICAL FIELD

Embodiments of the invention relate to a composite film and a fabrication method thereof, a photoelectric element and a photoelectric apparatus.

BACKGROUND

Currently, application of a composite film in display and illumination will be a new direction for future display and illumination technologies. It is well known that white light is obtained by a combination of colors such as red, green, blue and yellow, and typically, respective colors are achieved by their respective corresponding light-emitting materials, which can achieve white light by co-doping.

In recent years, a new type of semiconductor nano-material—quantum dots—emerges, which is also known as a semiconductor nano-crystal, with a size between 1-10 nm. Due to a quantum size effect and a dielectric confinement effect, the quantum dots have unique photo-luminescent and electroluminescent properties. As compared with conventional organic fluorescent dyes, the quantum dots have superior optical characteristics such as high quantum efficiency, high photochemical stability, not prone to photolysis, and broad excitation, narrow emission, high color purity, and having luminous colors adjustable by controlling the size of the quantum dots. Thus, white light is often achieved by using the quantum dots in the prior art. There is a film emitting white light, which is obtained by mixing the quantum dots of a plurality of different colors; however, at the time of achieving white light, phenomena such as agglomeration and fluorescence quenching are apt to occur between the quantum dots.

SUMMARY OF THE INVENTION

According to an embodiment of the invention, there is provided a fabrication method of a composite film, comprising:

Preparing a polyfluorene-based compound solution, wherein the polyfluorene-based compound solution includes polyfluorene or polyfluorene derivatives;

Preparing a quantum dot solution, wherein the quantum dot solution includes quantum dots;

Mixing the polyfluorene-based compound solution and the quantum dot solution together to prepare a mixed solution; and Removing a solvent in the mixed solution to prepare the composite film.

In one example, the polyfluorene derivatives include one or more materials selected from the group consisting of poly(9,9-dialkyl fluorene), copolymer of bis-hexyl fluorene and anthracene, biphenyl with dendrite-containing side chains, tetra-alkyl-substituted indenofluorene polymer, aryl-substituted indenofluorene polymer, polyfluorene-bithiophene alternate copolymer, as well as, fluorene and thiophene, ethylene dioxythiophene, 4,7-dithiophene-2,1,3-benzothiadiazole, binary and ternary random copolymers of 4,7-dithiophene-2,1,3-benzoselenadiazole.

In one example, the quantum dots include at least one of Group II-VI element compounds and Group III-V element compounds.

In one example, a concentration of the polyfluorene-based compound solution is 3 wt %-25 wt %; and a concentration of the quantum dot solution is 4 mg/ml-30 mg/ml; and In the mixed solution, the polyfluorene based compound solution accounts for 50 wt %-90 wt %, and the quantum dot solution accounts for 10 wt %-50 wt %.

In one example, the solvent in the polyfluorene-based compound solution is methylbenzene, chlorobenzene or chloroform, and the solvent in the quantum dot solution is methylbenzene, chlorobenzene or chloroform.

In one example, the solvent in the polyfluorene-based compound solution is methylbenzene, and the solvent in the quantum dot solution is methylbenzene.

In one example, the removing a solvent in the mixed solution to prepare the composite film, includes:

Removing the solvent to prepare the composite film, after preparing the mixed solution into a film by a method of spin coating, inkjet printing or printing.

According to another embodiment of the invention, there is provided a composite film, fabricated by using the above-described fabrication method.

In one example, in the composite film, a range of mass ratio of the polyfluorene-based compounds to the quantum dots is 400:1-5:1, wherein the polyfluorene-based compounds include polyfluorene or polyfluorene derivatives.

According to a further embodiment of the invention, there is provided a photoelectric element, including the above-described composite film.

According to still a further embodiment of the invention, there is provided a photoelectric apparatus, including the above-described photoelectric element.

In the above-described technical solutions provided by the embodiments of the invention, polyfluorene emitting blue light and its derivatives are used as a matrix, compounded with the quantum dots emitting red light to form a film, with polyfluorene or polyfluorene derivatives as a short-wavelength portion in a white spectrum, and with the quantum dots as a long-wavelength portion, to achieve white light by light compensation. The film emitting white light is obtained only on a physical color complementarity principle; a desired color gamut value can be obtained by controlling a ratio of a fluorescent polymer (polyfluorene or polyfluorene derivatives) to the quantum dots, which can also avoid the phenomena of agglomeration and fluorescence quenching that occur when white light is achieved currently by using a quantum dot mixing method; in addition, there is a wide range for selecting and applying the materials of polyfluorene or polyfluorene derivatives and the quantum dots. The composite film fabricated by using the fabrication method provided by the invention has a good uniformity, and different polymer materials can be selected according to the spectrum of the quantum dots, which renders a wide applicability.

BRIEF DESCRIPTION OF THE DRAWINGS

In order to clearly illustrate the technical solution of the embodiments of the invention, the drawings of the embodi- FIG. 1 is a flow schematic diagram of a fabrication method of a composite film provided by an embodiment of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the invention provides a fabrication method of a composite film, as shown in FIG. 1, the fabrication method including steps of:

S1: preparing a polyfluorene-based compound solution.

Optionally, a solvent of the polyfluorene-based compound solution includes methylbenzene, chlorobenzene or chloroform, for example, the solvent in the polyfluorene-based compound solution includes methylbenzene; a solute in the polyfluorene-based compound solution is polyfluorene or polyfluorene derivatives. A concentration of the polyfluorene-based compound solution is 3 wt %-25 wt %.

Optionally, the polyfluorene derivatives include one or more materials selected from the group consisting of poly (9,9-dialkyl fluorene) (P17), copolymer of bis-hexyl fluorene and anthracene (P18), biphenyl with dendrite-containing side chains (P19), tetra-alkyl-substituted indenofluorene polymer (P21a), aryl-substituted indenofluorene polymer (P21b), triphenylamine coupled with two ends of anthracene-alkylfluorene emitting blocks (P22a), oxdiazole coupled with two ends of anthracene-alkylfluorene emitting blocks (P22b), polyfluorene-bithiophene alternate copolymer (P23), octyl-disubstituted fluorene and benzothiadiazole alternate copolymer (P24), copolymer with a main chain coupled with iridium complex and phenylpyridine (P25); as well as, fluorene and thiophene (Th); ethylene dioxythiophene (EDT); 4,7-dithiophene-2,1,3-benzothiadiazole (DBT); and binary and ternary random copolymer of 4,7-dithiophene-2,1,3-benzoselenadiazole (BTSe).

Polyfluorene and its derivatives have a relatively large energy band gap, which are the materials emitting blue light, and which, due to a biphenyl unit within a rigid plane contained thereby, has a relatively high thermal stability and chemical stability, so that the composite film fabricated has a higher thermal stability and chemical stability, and polyfluorene and its derivatives have a relatively high fluorescence quantum efficiency (0.6-0.8) in a solid state, thus enabling the composite film to have a relatively high fluorescence efficiency, and to enhance a fluorescence strength.

S2: preparing a quantum dot solution.

Optionally, the solvent in the quantum dot solution includes methylbenzene, chlorobenzene or chloroform, for example, the solvent in the quantum dot solution includes methylbenzene, the solute in the quantum dot solution is the quantum dots, and a concentration of the quantum dot solution is 4 mg/ml-30 mg/ml.

The quantum dots in the embodiment of the invention are nanoparticles consisting of at least one of Group II-VI element compounds and Group III-V element compounds. Therein, the nano-particles consisting of Group II-VI element compounds are compound semiconductor materials made of Group II elements Zn, Cd and Hg and Group VI elements S, Se and Te, an expression of Group II-VI element compounds being A(II)B(VI), i.e., ZnS, ZnSe, ZnTe, CdS, CdSe, CdTe, HgS, HgSe and HgTe; the nano-particles consisting of Group III-V element compounds are compound semiconductor materials made of Group III elements B, Al, Ga and In, and Group V elements N, P, As and Sb, and an expression of Group III-V element compounds being A(III)B(V), for example, BN, BP, BAs, BSb, AlN, AlP, AlAs, AlSb, GaN, GaP, GaAs, GaSb, InAs, InN, InP and InSb.

For example, a light-emitting wavelength of the quantum dots may be controlled by controlling sizes and materials thereof. For example, the quantum dots may be controlled to emit red light or green light.

For example, a concentration of the polyfluorene-based compound solution is 5 wt %-15 wt %. A concentration of the quantum dot solution is 5 mg/ml-15 mg/ml.

It should be noted that, a sequence between step S1 of preparing the polyfluorene-based compound solution and step S2 of preparing the quantum dot solution as described above is not limited. For example, step S1 may be performed before step S2, or step S1 may be performed after step S2, or step S1 and step S2 are performed simultaneously.

S3: mixing the polyfluorene-based compound solution and the quantum dot solution together, to prepare a mixed solution.

The polyfluorene-based compound solution prepared in step S1 and the quantum dot solution prepared in step S2 are mixed together in a specific ratio.

Optionally, in a case that a concentration of the polyfluorene-based compound solution is 3 wt %-25 wt %, and a concentration of the quantum dot solution is 4 mg/ml-30 mg/ml, the specific ratio is the polyfluorene-based compound solution: the quantum dot solution=9:1-1:1 (mass ratio). That is, in the mixed solution, the polyfluorene-based compound solution accounts for 50 wt %-90 wt %, and the quantum dot solution accounts for 10 wt %-50 wt %.

S4: removing the solvent in the mixed solution, to prepare the composite film.

After the mixed solution is prepared in step S3, the solvent may be removed to prepare the composite film, after the mixed solution is prepared into a film by the method of spin coating, inkjet printing or printing.

The preparation of the composite film by the method of spin coating includes steps of dropping the mixed solution onto a substrate, driving the substrate to rotate at a specific rotational speed by a spin coater so that the mixed solution is uniformly spread into a film, and finally removing the solvent (i.e., methylbenzene, chlorobenzene or chloroform) by means of vacuum evaporation or high temperature evaporation, to form the composite film.

The preparation of the composite film by the method of ink-jet printing or printing includes steps of: printing the mixed solution onto the substrate by an inkjet printer or a printer, and then removing the solvent (i.e., methylbenzene, chlorobenzene or chloroform) by means of vacuum evaporation or high temperature evaporation, to form the composite film.

Exemplarily, the polyfluorene-based compound solution (with a concentration of 12 wt %) with a emission spectrum at 450 nm and a ZnS quantum dot solution with an emission peak at 620 nm are mixed in a ratio of 3:1 (mass ratio), which, by using the method of spin coating, is spin coated for 30 s at a rotational speed of 3,000 rpm, and then heated to remove the solvent, so as to prepare the composite film.

After the composite film has been fabricated in step S4, the composite film can be illuminated by a blue LED light, and the composite film can emit white light; of course, the composite film can also be powered to emit white light.

The fabrication method of the invention is simple, in which the polyfluorene emitting blue light and its derivatives are used as a matrix, compounded with the quantum dots emitting red light to form a film, with polyfluorene or polyfluorene derivatives as a short-wavelength portion and with the quantum dots as a long-wavelength portion in a white spectrum, to achieve white light by light compensation. The film emitting white light is obtained only on a physical color complementarity principle; and there is a wide range for selecting and applying the materials of polyfluorene and polyfluorene derivatives and the quantum dots.

The fabrication method of the invention is simple, the desired color gamut value can be obtained by controlling the ratio of the fluorescent polymer (polyfluorene or polyfluorene derivatives) to the quantum dots, which can also avoid the phenomena of agglomeration and fluorescence quenching that occur when white light is achieved currently by using a quantum dot mixing method; in addition, the composite film fabricated by the fabrication method provided by the invention has a good uniformity, and different polyfluorene or polyfluorene derivatives can be selected according to the spectrum of the quantum dots, exemplarily, for the quantum dots CdSe, if different polyfluorene or polyfluorene derivatives are selected, then the composite film fabricated, after illuminated by blue light or powered, can emit white light of different color gamut, and is applicable to different environments.

An embodiment of the invention further provides a composite film, which is fabricated by using the above-described fabrication method, the composite film comprising; polyfluorene or polyfluorene derivatives, as well as quantum dots, wherein a range of mass ratio of the polyfluorene or polyfluorene derivatives to the quantum dots covers 400:1-5:1.

For example, a range of mass ratio of the polyfluorene or polyfluorene derivatives to the quantum dots is 120:1-10:1.

An embodiment of the invention further provides a photoelectric element including the above-described composite film, and the photoelectric element may be: a photoelectric conversion device, a color filter, a backlight, a polarizer, a light emitting layer and the like.

An embodiment of the invention further provides a photoelectric apparatus, which includes the above-described composite film, and which may be: an illumination device, a liquid crystal display panel, an e-paper, an organic electroluminescence display (OLED), a mobile phone, a tablet personal computer, a television, a monitor, a laptop, a digital photo frame, a navigator, and any other product or component having an illumination or a display function.

Optionally, the composite film may be powered to emit light, so the composite film can be used for fabricating the photoelectric conversion device, to perform photoelectric conversion.

Optionally, the composite film may be applied to the product or component having an illumination function, exemplarily, the composite film may be powered or illuminated by blue light to emit white light, for use in an illuminating apparatus.

Alternatively, the composite film may be made into a light emitting layer, for use in an organic electroluminescent device. Exemplarily, a light emitting layer in the organic electroluminescent device is the composite film, and after powered, the organic electroluminescent device emits white light.

Alternatively, the composite film may be powered or illuminated by blue light to emit white light, and may be applied as the backlight for use in the liquid crystal display panel, and any other product or component having a display function.

The foregoing embodiments merely are exemplary embodiments of the invention, and not intended to define the scope of the invention, and the scope of the invention is determined by the appended claims.

The present application claims priority of Chinese Patent Application No. 201310495376.X filed on Oct. 21, 2013, the disclosure of which is incorporated herein by reference in its entirety as part of the present application.

What is claimed is:

1. A fabrication method of a composite film which can emit white light, comprising:

preparing a polyfluorene-based compound solution, wherein the polyfluorene-based compound solution includes polyfluorene or polyfluorene derivatives which can emit blue light;

preparing a quantum dot solution from quantum dots which can emit red or green light;

mixing the polyfluorene-based compound solution and the quantum dot solution together to prepare a mixed solution; and removing a solvent in the mixed solution to prepare the composite film, wherein the solvent in the polyfluorene-based compound solution is methylbenzene, and the solvent in the quantum dot solution is methylbenzene.

2. The fabrication method according to claim 1, wherein, the polyfluorene derivatives include one or more materials selected from the group consisting of poly (9,9-dialkyl fluorene), copolymer of bis-hexyl fluorene and anthracene, biphenyl with dendrite-containing side chains, tetra-alkyl-substituted indenofluorene polymer, aryl-substituted indenofluorene polymer, polyfluorene-bithiophene alternate copolymer, as well as, fluorene and thiophene, ethylene dioxythiophene, 4,7-dithiophene-2,1,3-benzothiadiazole, binary or ternary random copolymers of 4,7-dithiophene-2,1,3-benzoselenadiazole.

3. The fabrication method according to claim 1, wherein the quantum dots include Group II-VI element compounds or Group lll-V element compounds.

4. The fabrication method according to claim 1, wherein a concentration of the polyfluorene-based compound solution is 3 wt %-25 wt %; and a concentration of the quantum dot solution is 4 mg/ml-30 mg/ml; and in the mixed solution, the polyfluorene-based compound solution accounts for 50 wt %-90 wt %, and the quantum dot solution accounts for 10 wt %-50 wt %.

5. The fabrication method according to claim 1, wherein the removing a solvent in the mixed solution to prepare the composite film includes:

removing the solvent to prepare the composite film, after preparing the mixed solution into a film by a method of spin coating, inkjet printing or printing.

* * * * *